US007483823B2

(12) United States Patent
Alfieri

(10) Patent No.: US 7,483,823 B2
(45) Date of Patent: Jan. 27, 2009

(54) BUILDING INTEGRATED CIRCUITS USING LOGICAL UNITS

(75) Inventor: Robert A. Alfieri, Chapel Hill, NC (US)

(73) Assignee: NVIDIA Corporation, Santa Clara, CA (US)

( * ) Notice: Subject to any disclaimer, the term of this patent is extended or adjusted under 35 U.S.C. 154(b) by 584 days.

(21) Appl. No.: 11/158,180

(22) Filed: Jun. 21, 2005

(65) Prior Publication Data
US 2007/0005321 A1    Jan. 4, 2007

(51) Int. Cl.
    *G06F 17/50*    (2006.01)
    *G06F 9/45*    (2006.01)

(52) U.S. Cl. ............... 703/14; 716/5; 716/18; 717/104; 717/135; 703/19

(58) Field of Classification Search ............ 703/27, 703/28, 2, 14, 19; 716/5, 18; 717/104, 135, 717/143
See application file for complete search history.

(56) References Cited

U.S. PATENT DOCUMENTS

| | | | |
|---|---|---|---|
| 5,471,398 | A | 11/1995 | Stephens |
| 5,841,663 | A | 11/1998 | Sharma et al. |
| 6,477,683 | B1 | 11/2002 | Killian et al. |
| 6,647,524 | B1 | 11/2003 | Huang et al. |
| 6,853,970 | B1 | 2/2005 | Gupta et al. |
| 7,313,773 | B1 * | 12/2007 | Braun et al. ............ 716/5 |
| 7,363,610 | B2 * | 4/2008 | Alfieri ................ 716/18 |
| 2003/0033595 | A1 | 2/2003 | Takagi et al. |
| 2004/0165588 | A1 * | 8/2004 | Pandya ............ 370/389 |
| 2004/0260528 | A1 | 12/2004 | Ballagh et al. |
| 2005/0049843 | A1 | 3/2005 | Hewitt et al. |
| 2006/0117279 | A1 | 6/2006 | Van Ginneken et al. |
| 2007/0005329 | A1 | 1/2007 | Alfieri |

FOREIGN PATENT DOCUMENTS

| | | |
|---|---|---|
| EP | 0 848 342 A2 | 6/1998 |
| EP | 1 517 254 A2 | 3/2005 |
| WO | WO 00/19343 | 4/2000 |
| WO | WO 03/091914 | 11/2003 |

OTHER PUBLICATIONS

Shackleford, B. et al.: "Satsuki: An Integrated Processor Synthesis and Compiler Generation System", IEICE Transactions on Information and Systems, Information & Systems Society, Tokyo, JP, vol. E79-D, No. 10, Oct. 1996, pp. 1373-1381, XP000635525, ISSN: 0916-8532.
Bergamaschi R. et al.: "Coral-Automating the Design of Systems-on-Chip Using Cores", Proceedings of the IEEE 2000 Custom Integrated Circuits Conference. (CICC 2000). Orlando, FL, May 21-24, 2000, IEEE Custom Integrated Circuits Conference. CICC, New York, NY: IEEE, US, vol. CONF. 22, May 21, 2000, pp. 109-112, XP002186200, ISBN: 0-7803-5810-4.

* cited by examiner

*Primary Examiner*—Thai Phan
(74) *Attorney, Agent, or Firm*—Patterson & Sheridan, LLP

(57) ABSTRACT

Systems and methods for designing and generating integrated circuits using a high-level language are described. The high-level language is used to generate performance models, functional models, synthesizable register transfer level code defining the integrated circuit, and verification environments. The high-level language may be used to generate templates for custom computation logical units for specific user-determined functionality. The high-level language and compiler permit optimizations for power savings and custom circuit layout, resulting in integrated circuits with improved performance per watt of power consumption.

24 Claims, 10 Drawing Sheets

Source Code
130

ATREE Database
135

MTREE Database
140

RTREE Database
142

Specific Trees and Models
145

Figure 1B

BUILDING INTEGRATED CIRCUITS USING LOGICAL UNITS

BACKGROUND OF THE INVENTION

1. Field of the Invention

Embodiments of the present invention generally relate to computer-aided design of integrated circuits and, more specifically, to the generation of various models from a common database.

2. Description of the Related Art

Conventional computer-aided design of integrated circuits uses different code databases to generate various models of the integrated circuit. A significant number of man and machine hours are needed to verify that the different models are correct. For example, an architectural model, typically written by an engineering team, of the integrated circuit is used to define the functional requirements. A register transfer level (RTL) model of the integrated circuit is then produced, typically by another engineering team, and the functionality of the RTL model is verified against the architectural model. A cycle accurate performance model of the integrated circuit may also be developed to tune the architectural model and the RTL model. Because each model is developed using a different language, verification of each model is essential to ensure the fabricated integrated circuit functions properly. However, verification of each model is also time consuming, for example, typically requiring writing of verification testbenches and tests and of formal verification testbenches and assertions.

Accordingly, there is a need for a high-level language that may be used to generate a common database from which various models of an integrated circuit can be generated.

SUMMARY OF THE INVENTION

The current invention involves new systems and methods for designing and generating integrated circuits. A high-level language is used to build an integrated circuit, including generation of performance simulations, functional models, synthesizable RTL code defining the integrated circuit, and verification environments. The high-level language or a sublanguage of the high-level language may be used to generate templates for custom computation logical units for specific functionality. The high-level language and compiler permit optimizations for power-savings and custom circuit layout, resulting in integrated circuits with improved performance per watt of power consumption.

Various embodiments of a method of the invention for designing an integrated circuit include generating a common database representing the integrated circuit from source code written in a high-level language. The high-level language is used to specify programmable logical units, wherein a complete representation of the programmable logical units is included in the common database. A template specified by one of the programmable logical units is generated for a customizable logical unit written in the high-level language or sublanguage, wherein the template includes a representation of interfaces to and from the customizable logical unit. A portion of the common database representing the integrated circuit is optimized to produce a target-specific tree, wherein the target-specific tree corresponds to at least one of a variety of target models of the integrated circuit and includes a representation of the customizable logical unit.

Various embodiments of the invention include a computer-readable medium storing instructions for causing a computing device to produce various final target models of an integrated circuit. The computer-readable medium includes a first set of instructions, a second set of instructions, and a third set of instructions. When executed, the first set of instructions generate a first portion of a common database representing the integrated circuit from source code written in a high-level language, wherein the first set of instructions specifies programmable logical units. When executed, the second set of instructions generate a second portion of the common database representing the integrated circuit from source code written in the high-level language, wherein the second set of instructions specifies customizable logical units. When executed, the third set of instructions optimize a portion of the common database representing the integrated circuit to produce a target-specific tree, wherein the target-specific tree corresponds to at least one of the various final target models of the integrated circuit.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1B illustrates the system components generated by the high-level language to produce various specific models of the integrated circuit when the method steps shown in FIG. 1A are performed in accordance with one or more aspects of the present invention.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

A High-Level Language for Building Integrated Circuits

A new, high-level language is capable of generating most of an integrated circuit, including various models of the integrated circuit, such as, performance models, functional models, emulation models. When compiled, the high-level language produces an architectural tree (ATree) that is a semantically decorated source tree from which other trees, MTree and RTree are produced. The MTree is a common database representing the integrated circuit which optimizers may use to generate specific models such as performance simulation models, software templates, and functional simulation environments. In some embodiments of the present invention, the MTree does not include detailed timing information, although the MTree may include time-ordering dependencies, e.g., state machines, and the like. The RTree is a common database produced from the MTree.

Unlike the MTree, the RTree is timing-accurate and includes back annotated information based on the physical layout of the chip. The RTree represents the integrated circuit which optimizers may use to generate specific models such as synthesizable RTL code, low-power structures, physical design floor planning and layout, and semi-formal verification environments. Chip design time is shortened by using the common database to produce a variety of different models of the chip and environments. The optimizers and compilers used to produce the ATree, MTree, RTree, and specific models may be used to generate other chips, permitting programmers to efficiently and quickly write source code in the high-level language to produce each chip with greater reliability and in a shorter timeframe than when the different models are generated manually or using different databases. The common database also provides a central repository for the chip design, unifying the source code and generated databases within a single design environment.

Figure 1A:
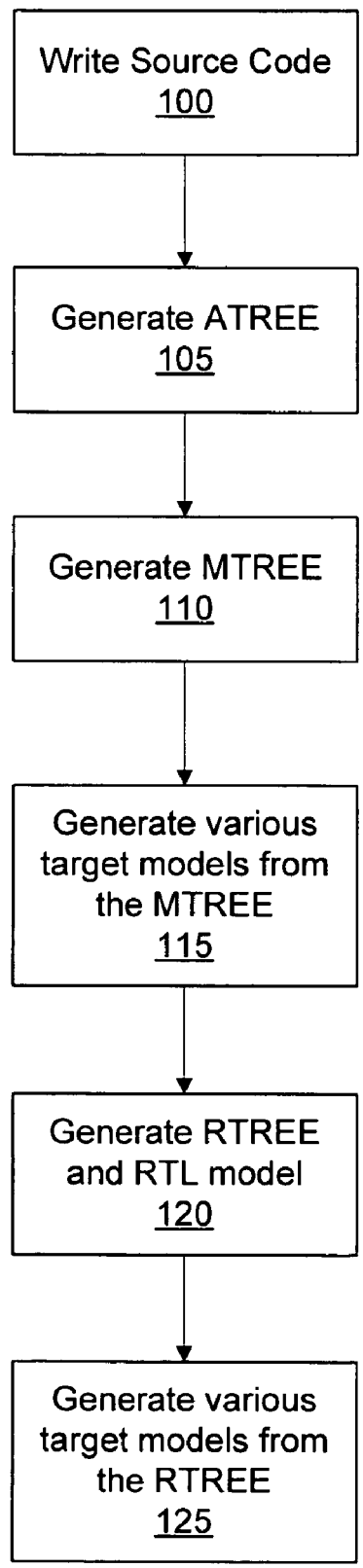
FIG. 1A illustrates a flow diagram of an exemplary method of using the high-level language to produce various specific models of the integrated circuit in accordance with one or more aspects of the present invention.

FIG. 1A illustrates a flow diagram of an exemplary method of using the high-level language to produce various specific models of the integrated circuit, e.g., chip, in accordance with one or more aspects of the present invention. In step 100 source code for the integrated circuit is written using the high-level language. An example of source code for a unit is described in conjunction with FIG. 1C.

In step 105 the source code is parsed into an intermediate tree format that models the source code, called an ATree. Step 105 is described in greater detail in conjunction with FIG. 2. In step 110 various PLU generators are called to compile the ATree into another intermediate tree format called an Mtree, as further described in conjunction with FIG. 3A. In step 115 target-specific optimizers are used to generate optimized Mtrees to produce corresponding target models, as described in conjunction with FIGS. 4A and 4B.

Figure 3A:
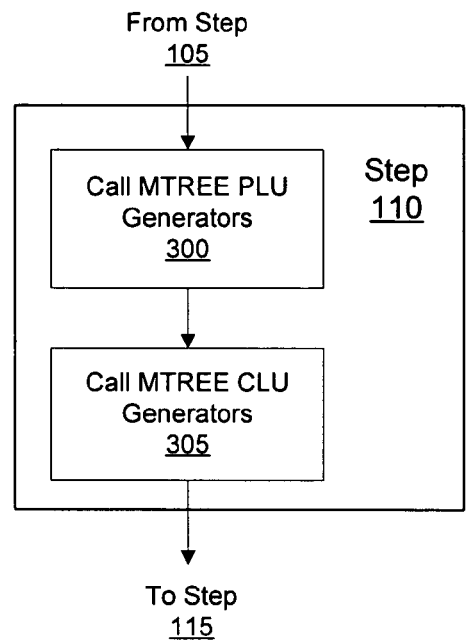
FIG. 3A illustrates a flow diagram of exemplary methods of performing step 110 shown in FIG. 1A to generate an MTree in accordance with one or more aspects of the present invention.
Figure 3B:
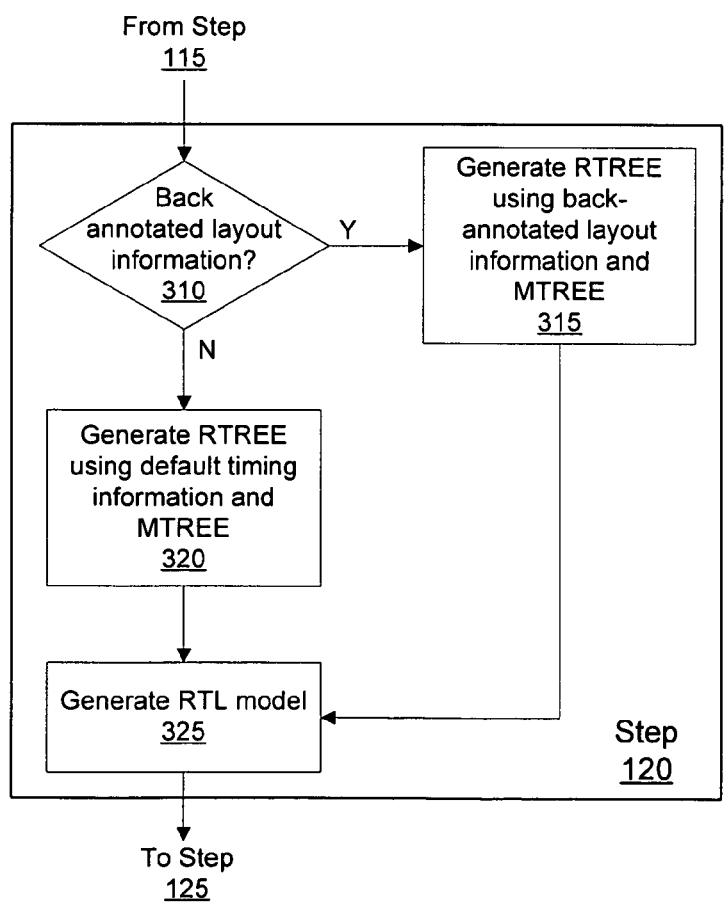
FIGS. 3B, 3C, and 3D illustrate flow diagrams of exemplary methods of performing step 115 shown in FIG. 1A to generate an RTree in accordance with one or more aspects of the present invention.

In step 120 the Mtree is combined with timing information to produce another intermediate tree format called an Rtree, as further described in conjunction with FIG. 3B. In step 125 target-specific optimizers are used to generate optimized Rtrees to produce corresponding target models, as described in conjunction with FIGS. 4C, 4D, 4E, and 4F.

The MTree and RTree each model modules, interfaces, and logic and when combined are a superset of the functionality needed to generate all final targets, e.g., models, templates, environments, and the like. The MTree and RTree are an intermediate code tree that abstracts details of the final target code format. The MTree and RTree include utilities for constructing modules, interfaces, and logic within modules.

Unlike the RTree, the MTree does not include cycle accurate timing information to simplify the PLU and CLU generators that process the MTree to produce models and environments that do not require cycle accurate information. The RTree is generated from the MTree and timing information based on back annotated information from the physical layout of the chip that may affect target-specific models generated from the RTree. When the timing information based on the chip layout is not available, for example, when the RTree is generated for the first time, default timing information is used to produce the RTree. Alternatively, user-specified timing or back annotated synthesis information may be used in place of or in addition to back annotated information from the physical layout.

In contrast, the MTree is not affected by the physical layout of the chip, and therefore does not receive the back annotated information. In step 120 optimizers are called to compile portions of the MTree and RTree and produce the final targets. Persons skilled in the art will appreciate that any system configured to perform the method steps of FIG. 1A or its equivalent, is within the scope of the present invention.

FIG. 1B illustrates the system components generated by the high-level language to produce various specific models of the integrated circuit when the method steps shown in FIG. 1A are performed in accordance with one or more aspects of the present invention. As previously described, source code 130 for the integrated circuit is written using the high-level language. The ATree database 135 is produced from source code 130. The MTree database 140 is produced from ATree database 135. The MTree database 140 may include nodes that point back into nodes in the ATree database 135, reducing redundancy and ensuring that the code is consistent between the MTree database 140 and the ATree database 135. In one embodiment of the present invention, a base C++ class is used to implement node traversal. For each tree database a "node kind" is used that is in a different numeric space from nodes in the other tree databases. Derived C++ classes enforce traversal of nodes corresponding to a particular tree.

The RTree database 142 is produced from the MTree database 140. The RTree database 142 may include nodes that point back into nodes in the MTree database 140, reducing redundancy and ensuring that the code is consistent between the MTree database 140 and the RTree database 142. Specific trees and models 145 are produced from MTree database 140 and RTree database 142. Physical properties from specific trees and models 145, such as a physical layout model, may be incorporated into RTree database 142 to improve performance and/or die area results of specific trees and models 145.

A feature of the high-level language is that it separates paradigms from computation. A paradigm is related to chip infrastructure, used for relatively generic functions such as data movement and temporary storage. Various paradigms may be used for each particular chip and the paradigms are often written specifically for each chip, even though they may be substantially identical to those used in a previous chip. In contrast, computations are not generic and often times represent unique algorithms and processing capabilities. Paradigms may be automatically generated from the high-level language while computations may be written by a programmer. In some embodiments of the present invention a sublanguage of the high-level language may be used to write computations or generators.

A chip produced from the high-level language includes units from two different classes, paradigm logical units (PLUs) and computation logical units (CLUs). A PLU is specified by the high-level language and may span one or more functional units or physical units in the chip. PLU logic and related environments may be automatically generated to provide a complete representation of the PLU in the MTree database. A CLU may be manually written, plugging into an automatically generated PLU wrapper, e.g., CLU template. CLUs typically perform well-defined functions and may be a few tens of lines of code. The generated PLU wrapper provides a framework and precise timing between the PLU and the CLU. A programmer may write code for the CLU and automatically generate standalone verification environments for testing the CLU. The generated PLU wrapper allows the CLU to be used in simulation models before the CLU specific code is written. Furthermore, programmer introduced errors are reduced since the programmer does not write code for the interface protocol since that is included in the generated PLU wrapper. Once the programmer has verified functionality of the CLU code within the generated CLU environment, the CLU will function properly in an enviroment including the CLU.

Traditionally, chip design requires programmers to code units that would be considered PLUs and CLUs. However, once a chip design is complete, the common portions of PLU-like functionality that could be reused are difficult to extract since the code is customized for the particular design mixing CLU-like functionality with PLU-like functionality. When the high-level language is used, the programmers may focus their time on coding specific CLUs and development of reusable optimizers to generate PLUs and PLU wrappers for CLUs.

Computation Logical Units

Examples of CLUs include functions that are performed in one or more clock cycles, such as, address translators, arbiters, arithmetic datapaths, data format converter, finite state machines, multiplexer, packet expander, or the like. A CLU is usually used by a single unit within one chip and is not typically reusable for other chips outside the same product line. A CLU usually lies within one layout partition and tends to be more compact in terms of die area, and therefore does not impact layout tradeoffs made during physical design.

A CLU programmer can verify functionality of the CLU within the generated PLU wrapper. In some cases, the CLU programmer may use self-checking tests to validate a CLU. For example, self-checking tests may be used to ensure an address translater CLU has good load balancing and no aliasing. Similarly, for math function CLUs, self-checking tests may be used to ensure smooth functions are produced with minimal round-off error. The CLU template functions properly within the larger chip-level environment and does not need to be verified by the CLU programmer. In addition to specifying interfaces the generated PLU wrapper provides a strict timing framework for the CLU. Early in the design process, the CLU template may be used with an estimate of the CLU die area to begin the physical design process for a chip. During physical design timing budgets will be negotiated or timing vs. area tradeoffs will be made between PLUs and CLUs.

Paradigm Logical Units

A PLU may be reused in different part of the chip, but typically has customizable or configurable parts, perhaps including one or more CLUs within the PLU. A PLU may embody one or more interfaces and each interface may transmit one or more types of packets. A packet specifies an interface of a PLU or CLU and is later translated into a signal associated with a physical wire within the integrated circuit. Multi-cycle packets are defined in the high-level language, as described further herein, and are automatically divided into distinct cycles at a later point in the design process, specifically by the PLU and CLU generators. The division is preferably based on physical design information or performance constraints specifying interface bandwidth values.

Unlike a CLU, a PLU typically spans multiple physical units on the chip, possibly spanning all physical units on the chip. Similarly, a PLU typically spans multiple layout partitions on the chip, and therefore may have a significant impact on the layout of the chip. PLUs don't usually perform functions, but instead move or temporarily store received packets. For example, a PLU may perform input queuing, arbitration, latency buffering, caching, monitoring for performance statistics, storing programmable values, or the like. PLUs may also implement industry standard interfaces such as PCI-E (peripheral component interface express) and the like.

Optimizers are used to produce PLUs based on a portion of the MTree or RTree. For example, an optimizer may be written by a programmer to generate a first-in first-out memory (FIFO). Various models, such as an RTL model, functional model (Fmodel), emulation model, and the like, may be produced using optimizers. Likewise, various environments may also be generated, in particular, verification environments. Rather than creating a verification environment to compare expected results between the different models, the generated verification environment is used to validate that the optimizer functions properly, i.e., generates a correct model so that the models produces by the optimizer are correct by construction. When a CLU is used within a PLU, a simple CLU that generates identifiable data patterns may be substituted for the actual CLU to verify the optimizer that generates the PLU. Rather than verifying each particular PLU, the programmer verifies an optimizer that may be configured using parameters to generate many different PLUs. For example, a FIFO generating optimizer may include parameters for multiple clocks, various data widths, various depths, testability options, and the like.

Functions performed by PLUs are typically more difficult to verify than the functions PLUs performed by CLUs due to their non-deterministic nature. Therefore, it is beneficial to generate PLUs, developing a reusable PLU generator that is used for several chip designs rather than manually writing code to perform similar functions. Using PLU generators improves efficiency by reducing time spent in design and verification of manually written code.

PLUs may also be formally verified, i.e., mathematically proving that an RTL model is correct by inserting assertion statements for inputs and outputs, then running the RTL model through formal verification tools in a piecewise manner. Specifically, upstream portions of a PLU may be formally verified before downstream portions of the PLU. Downstream portions of the PLU may use output constraints from the upstream portions as their input constraints. The constraints used in this piecewise formal verification may be automatically generated for each portion of the PLU or for an entire PLU.

Common attributes for PLUs produced by generators include a reset signal that is globally recognized and is therefore properly connected to a functional and physical reset tree. An idle signal may also be included that indicates when the PLU is not processing data. PLUs may also have multiple clock domains with proper asynchronous boundaries between different clock domains. Various interface protocols may be specified or selected based on physical design constraints for each PLU interface. For example, possible interface protocols include a request/busy protocol or a valid/credit protocol. The request/busy protocol specifies that the PLU presents a packet (request=1), transferring the packet to the recipient during a clock cycle when busy=0. The valid/credit protocol specifies that the PLU must receive a credit from the recipient before presenting a packet to the recipient. Interfaces using the valid/credit protocol may be implemented using high-speed source synchronous transfers as needed based on physical design constraints. Whether or not an interface is source synchronous, valid/credit, request/busy, or the like, is irrelevant to the programmer, therefore the protocol selection is typically made during generation of the physical design model of the chip and may be based on the distance the interface needs to travel across the chip.

Input packets for a PLU or CLU may be placed into one or more virtual channels and multi-threaded input FIFO memory models are automatically generated by PLU or CLU generators, respectively. Specification of a dedicated slot or a shared slot distribution may be programmed using the high-level language. Assignment to the virtual channels may be static, e.g. based on a least significant bit (LSB) of a packet field, such as a target partition number, or dynamic, e.g., based on a combination of a row and bank of a memory page. An input FIFO memory for a PLU or CLU may be specified in terms of a number of packets of a particular type. Alternatively, the input FIFO memory may be automatically sized based on a synchronous or asynchronous transfer latency, even including repeaters, if needed, based on physical design information. In response to an input packet, a PLU or CLU may output data that is stallable, nonstallable, or based on a credit signal from a CLU. An input packet may be consumed immediately by the receiving PLU or CLU or stored in a storage resource, such as a single or multi-threaded FIFO memory, cache, or the like. Alternatively, an input packet may be passed through a CLU configured to perform a data filtering function before being stored.

The high-level language or sublanguage of the high-level language permits specification of parameters for input caches within PLUs and CLUs. These parameters may specify, but are not limited to (i) associativity, e.g., direct-mapped, fixed, full, number of banks, sectoring, (ii) data coherency mechanism, e.g., write-back, write through, or read-only, or (iii) line replacement algorithm, e.g., least recently used (LRU), least recently allocated (LRA), or customized using a CLU. Specialy operations such as, invalidation policies, write-back flushes, and replacing a line or the entire cache, may also be specified using parameters. Cache tag lookup mechanisms may be automatically generated or customized using a CLU.

As previously described, a PLU generator may be designed to specify an industry standard interface such as PCI-E. Such a PLU generator may also be configured using parameters to specify a number of byte lanes, number of virtual channels, whether a virtual channel includes read return data reordering, a maximum number of outstanding reads for a virtual channel, or a number of peer-to-peer remapping register sets. A PLU may also be processed to produce a functional, performance, or other model.

Similarly, PLU generators may be designed to specify a host interface, a memory interface, a memory management unit, or the like. A PLU generator for a host interface may be configured using parameters to specify depths of host processor read and write FIFO memories, control registers, a dedicated host processor write virtual channel, a number of push buffers, a number of direct memory access (DMA) engines, or instance block handling. A PLU generator for a memory interface may be configured using parameters to specify memory configurations and memory type. A PLU generator for a memory management unit may be configured using parameters to specify a number of clients, and client-specific requirements, e.g., a maximum number of outstanding requests for each client, whether or not misaligned requests should be broken up, or whether or not reorder buffering is needed for out-of-order returns, or the like.

PLUs and CLUs may be context-switchable, meaning that data in the PLU during any clock cycle may be scanned into or out of the PLU or CLU. Power saving features, such as clock gating may also be included in PLUs and CLUs. Performance monitoring signals may also be automatically generated for the PLUs and CLUs and automatically routed to a power monitoring control unit. Implementing these features in PLU generators and CLU template generators ensures that the features function correctly for each PLU and CLU, compared with manually writing each PLU which is prone to errors due to different interpretations of each feature by programmers. Furthermore, schedule constraints often result in the inclusion of fewer power management optimizations. Automating the chip implementation and power optimizations results in a more efficient and possibly lower-cost device.

An Exemplary Logical Unit Represented in the High-Level Language

Figure 1C:
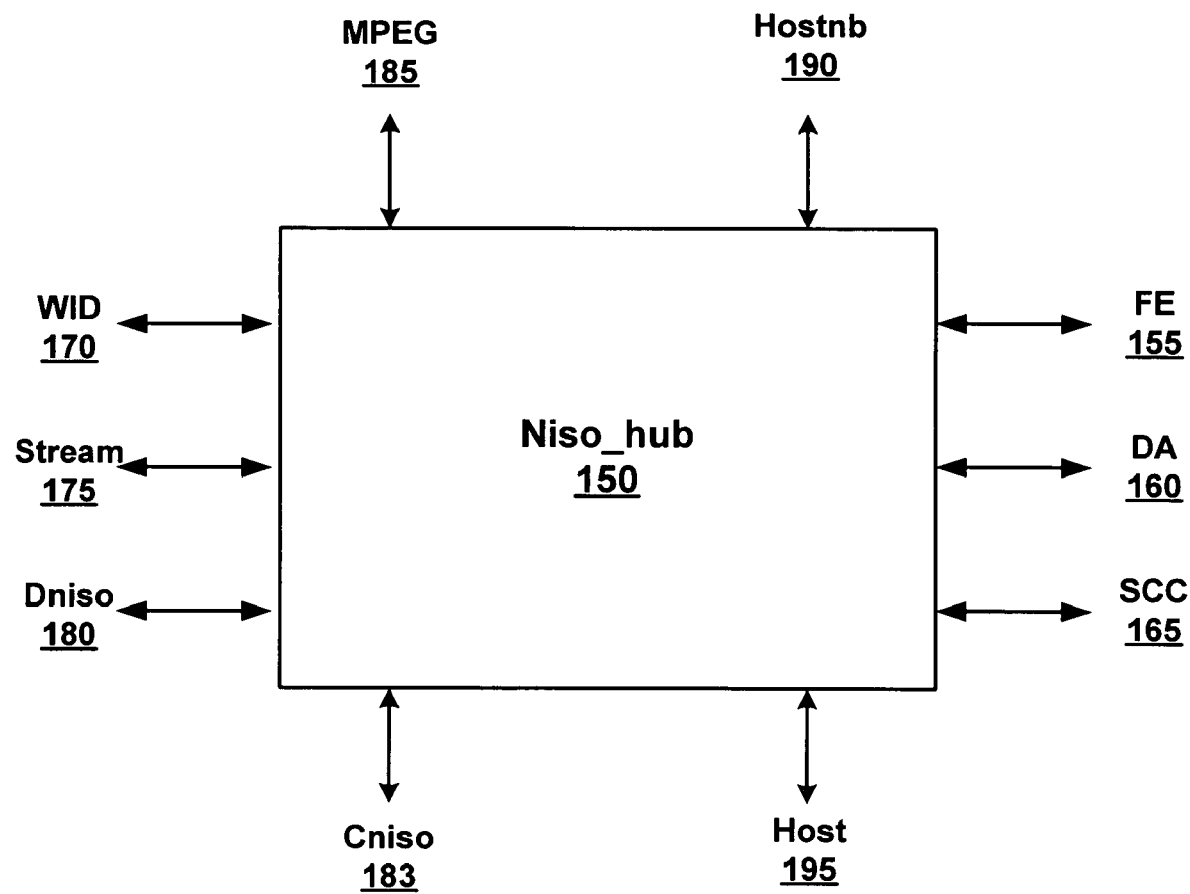
FIG. 1C is a schematic representation of an exemplary logical unit represented in the high-level language in accordance with one or more aspects of the present invention.

A logical unit (LU) includes a collection of PLUs, CLUs, and lower level LUs. It may be a client or server of other LUs. FIG. 1C is a schematic representation of an exemplary logical unit, Niso_hub 150, represented in the high-level language in accordance with one or more aspects of the present invention. Niso_hub 150 interfaces with 10 clients, FE 155, DA 160, SCC 165, Host 195, Cniso 183, Dniso 180, Stream 175, WID 170, MPEG 185, and Hostnb 190. Niso_hub 150 receives the nvclk clock input. The clients are logical units that are defined using the high-level language. Each client interface may include these packets: xx2fb, fb2xx_ack, fb2xx_rdat, and fb2xx_flush_resp. There are mechanisms, described further herein, for specifying exceptions to the packets. The code shown in Table 1 establishes the interfaces of Niso_hub 150. By way of illustration, the code is defined using the high-level language. However, other languages may be used to define the function.

TABLE 1 lu niso_hub:
    clock nvclk
    client fe, da, scc, wid, stream, dniso, cniso, mpeg, hostnb, host:
        request packet xx2fb
        response packet fb2xx_ack
        response packet fb2xx_rdat
        response packet fb2xx_flush_resp The code shown in Table 2 specifies the xx2fb packet that is used in the interfaces of Niso_hub 150, where fb_op_t is an enumerated 3 bit field. The last column specifies the bitwidth for each field of the packet, e.g., op, rd, ctx_dma_idx, adr, subid, wid, sz, alom, and wdat. By way of illustration, the code is defined using the high-level language. However, other languages may be used to define the function.

TABLE 2 packet xx2fb:

| ctrl | fb_op_t | op | |
|------|---------|----|----|
| ctrl | U | rd | 1 |
| ctrl | U | ctx_dma_idx | 4 |
| ctrl | U | adr | 8 |
| ctrl | U | subid | 8 |
| ctrl | U | wid | 2 |
| ctrl | U | sz | 5 |
| ctrl | U | alom | 1 |
| data | U | wdat[!rd*(sz + 1)] | 256 |

The code shown in Table 3 specifies the fb2xx_ack, fb2xx_flush, and fb2xx_rdat packets that are used in the interfaces of Niso_hub 150. These packets each respond to the xx2fb packet and specific responses are defined. For example, when the op field in an xx2fb packet matches FB_OP_FLUSH, the flush_completed field of fb2xx_flush_resp is asserted. Similarly, when the rd field in an xx2fb packet is asserted, a subid field of a corresponding fb2xx_rdat packet is set equal to the subid field of the xx2fb packet and a rdat field (data returned for a read operation) of the corresponding fb2xx_rdat packet is sz+1 cycles long and 1<<(5+wid) bits wide per cycle. By way of illustration, the code is defined using the high-level language. However, other languages may be used to define the function.

TABLE 3

```
packet fb2xx_ack:
    response to xx2fb
        ctrl    U    status              4
packet fb2xx_flush_resp:
    response to xx2fb:
        when op == FB_OP_FLUSH
            ctrl    U    flush_completed  1
packet fb2xx_rdat:
    response to xx2fb:
        when rd
            ctrl    U    subid = xx2fb.subid
            data    U    rdat[xx2fb.sz+1] bits(xx2fb_wdat)
```

The code shown in Table 4 specifies exceptions to the specified xx2fb packet interface for FE 155. For example, the op field of an xx2fb packet may not have an enumerated value corresponding to FB_OP_BIND_PD and the ctx_dma_idx field may only have values between 0 and 7, inclusive. By way of illustration, the code is defined using the high-level language. However, other languages may be used to define the function.

TABLE 4

```
for client fe:
    for packet xx2fb:
        assert op != FB_OP_BIND_PD
        assert ctx_dma_idx in 0 . . . 7
```

The code shown in Table 5 specifies that fb2xx_flush_resp packets are not supported by WID 170 and specifies exceptions to the specified xx2fb packet interface for WID 170. For example, the op field of an xx2fb packet may not have an enumerated value corresponding to FB_OP_BIND_PD, FB_OP_BIND_INST_CLK_PTR, or FB_OP_FLUSH, the ctx_dma_idx field must have a value of 0, and the wid field must have a value of 2. The subid field is increased from 8 to 10 bits and the wdat field is decreased from 256 to 128 bits. By way of illustration, the code is defined the high-level language. However, other languages may be used to define the function.

TABLE 5

```
for client wid:
    delete packet fb2xx_flush_resp
    for packet xx2fb:
        ctrl    U    subid              10
        data    U    wdat[!rd*(sz+1)]   128
        assert op != FB_OP_BIND_PD
        assert op != FB_OP_BIND_INST_BLK_PTR
        assert op != FB_OP_FLUSH
        assert ctx_dma_idx == 0
        assert wid == 2
```

The code shown in Table 6 specifies exceptions to the specified xx2fb packet interface for Stream 175. For example, the op field of a xx2fb packet may not have a enumerated value corresponding to either FB_OP_BIND_PD or FB_OP_BIND_INST_BLK_PTR. The rd field is always negated, the ctx_dma_idx field has a value of 0, and the wid field has a value of 3. By way of illustration, the code is defined using the high-level language. However, other languages may be used to define the function.

TABLE 6

```
for client stream:
    for packet xx2fb:
        assert op != FB_OP_BIND_PD
        assert op != FB_OP_BIND_INST_BLK_PTR
        assert !rd
        assert ctx_dma_idx == 0
        assert wid == 3
```

The code shown in Table 7 specifies exceptions to the specified xx2fb packet interface for Dniso 180. For example, the ctx_dma_idx field is deleted. The op field of a xx2fb packet may not have a enumerated value corresponding to FB_OP_BIND_INST_BLK_PTR, FB_OP_BIND_PD, FB_OP_VIRTUAL, or FB_OP_BIND_INST_OBJ_PTR. The wdat field is reduced from 256 bits to 32 bits and the wid field has a value of 0. By way of illustration, the code is defined using the high-level language. However, other languages may be used to define the function.

TABLE 7

```
for client dniso:
    for packet xx2fb:
        delete ctx_dma_idx
        data    U    wdat[!rd*(sz+1)]   32
        assert op != FB_OP_BIND_PD
        assert op != FB_OP_BIND_INST_BLK_PTR
        assert op != FB_OP_BIND_INST_OBJ_PTR
        assert op != FB_OP_VIRTUAL
        assert wid == 0
```

The code shown in Table 8 specifies exceptions to the specified xx2fb packet interface for MPEG 185. For example, an mpeg_engine_id_idx_t field is added to the xx2fb packet and values for the mpeg_engine_id_idx_t field are determined using the ctx_dma_idx field. The wdat field is reduced from 256 bits to 128 bits and the wid field may only have values ranging from 0 to 2, inclusive. The op field may not have a enumerated value corresponding to FB_OP_BIND_PD. By way of illustration, the code is defined using the high-level language. However, other languages may be used to define the function.

TABLE 8

```
        enum_type mpeg_engine_id_idx_t:
          enum FB_MPEG_ENGINE_ID_IDX_VP 0
          enum FB_MPEG_ENGINE_ID_IDX_MDEC 1
          enum FB_MPEG_ENGINE_ID_IDX_ME 2
for client mpeg:
    for packet xx2fb:
        ctrl   mpeg_engine_id_idx_t engine_id_idx
        data   U   wdat[!rd*(sz+1)]   128
        assert op != FB_OP_BIND_PD
        assert (engine_id_idx == FB_MPEG_ENGINE_ID_IDX_VP &&
ctx_dma_idx in 0 . . . 8) ||
            (engine_id_idx == FB_MPEG_ENGINE_ID_IDX_MDEC &&
ctx_dma_idx in 0 . . . 4) ||
            (engine_id_idx == FB_MPEG_ENGINE_ID_IDX_ME &&
ctx_dma_idx in 0 . . . 4)
        assert wid in 0 . . . 2
```

In addition to defining the interfaces of Niso_hub 150, the high-level language is used to define the function of Niso_hub 150. The code shown in Table 9 specifies the functions performed by Niso_hub 150. For example, an arbitration function is specified and a "winning" packet is generated called winner1. CLUs eligibility, subrequest_info, wdat_reformatter, and rdat_reformatter are instantiated within Niso_hub 150 and code may be manually written to perform the function of those CLU. By way of illustration, the code is defined using the high-level language. However, other languages may be used to define the function.

A PLU arbitration function is performed to determine winner1 from packets received by Niso_hub 150 from clients FE 155, DA 160, SCC 165, Host 195, Cniso 183, Dniso 180, Stream 175, WID 170, MPEG 185, and Hostnb 190. An arbitration policy is specified and an option to use an "alom" bit received from the clients, where the alom bit is used to indicate that the client has "at least one more" xx2fb packet for Niso_hub 150. Winner1 is then sent to a hubtbl unit (not shown) within a fb2hubtib packet. Fields used in the fb2hubtlb packet are automatically copied from winner1 and unused fields are ignored. The wdat and we_fields are separated from winner1 and possibly held in a storage resource such as a register file or FIFO memory.

A subrequest is received from hubtlb in a hub2tbl2fb packet and is stored in a storage resource by client_id. The subrequests are reordered based on subresponse_numbers that are in the hub2tbl2fb packets.

The subrequest_info CLU should be written to perform a tracking function to determine the status for the clients' subrequests. Another arbitration function is used to determine winner2 based on the subrequests. The wdat_reformatter CLU should be written to perform data formatting of winner2, wdat, and we_. The wdat_reformatter produces a niso2xbar packet which is output to an XBAR unit. XBAR responds by sending rdat in an xbar2niso packet. The rdat_reformatter CLU should be written to output a fb2xx_rdat packet to the proper client based on the client_id in rdat.

TABLE 8

```
arbitrate winner1 from clients
    policy   programmable_fixed_prio
    alom       xx2fb.alom
    eligibility compute
send winner1 to hubtlb.fb2hubtlb:
    hold wdat, we_
receive subrequest from hubtlb.hub2tlb2fb:
    store into subrequests:
        bin by client_id
```

TABLE 8-continued

```
        reorder by subresponse_number
compute subrequest_info:
        in subrequest.client_id, subrequest.{last,status}
        out eligible[subrequests.num_bins]
        out status[subrequests.num_bins]
    arbitrate winner2 from subrequests
        policy   programmable_fixed_prio
        alom    !hubtlb2fb.last_subreq
        eligibility request_info.eligible
compute wdat_reformatter:
        in winner2, client[winner2].xx2fb.{wdat,we_}
        out niso2xbar   // packet
    send wdat_reformatter.niso2xbar to xbar.niso2xbar
    receive rdat from xbar.xbar2niso
    compute rdat_reformatter:
        in rdat
        out fb2xx_rdat //packet
    send rdat_reformatter.fb2xx_rdat to client[client_id].fb2xx_rdat
```

The high-level language may be used to instantiate one or more CLUs within a PLU. A template is generated within which a programmer can write a function, using the high-level language or sublanguage of the high-level language, to perform the necessary operations. A verification environment may also be generated for the CLU. Because the interfaces are specified in the PLU, the programmer may focus on implementing and verifying the functionality of the CLU rather than the interactions between the CLU and units it interfaces with.

A High-Level Language Compiler

Figure 2:
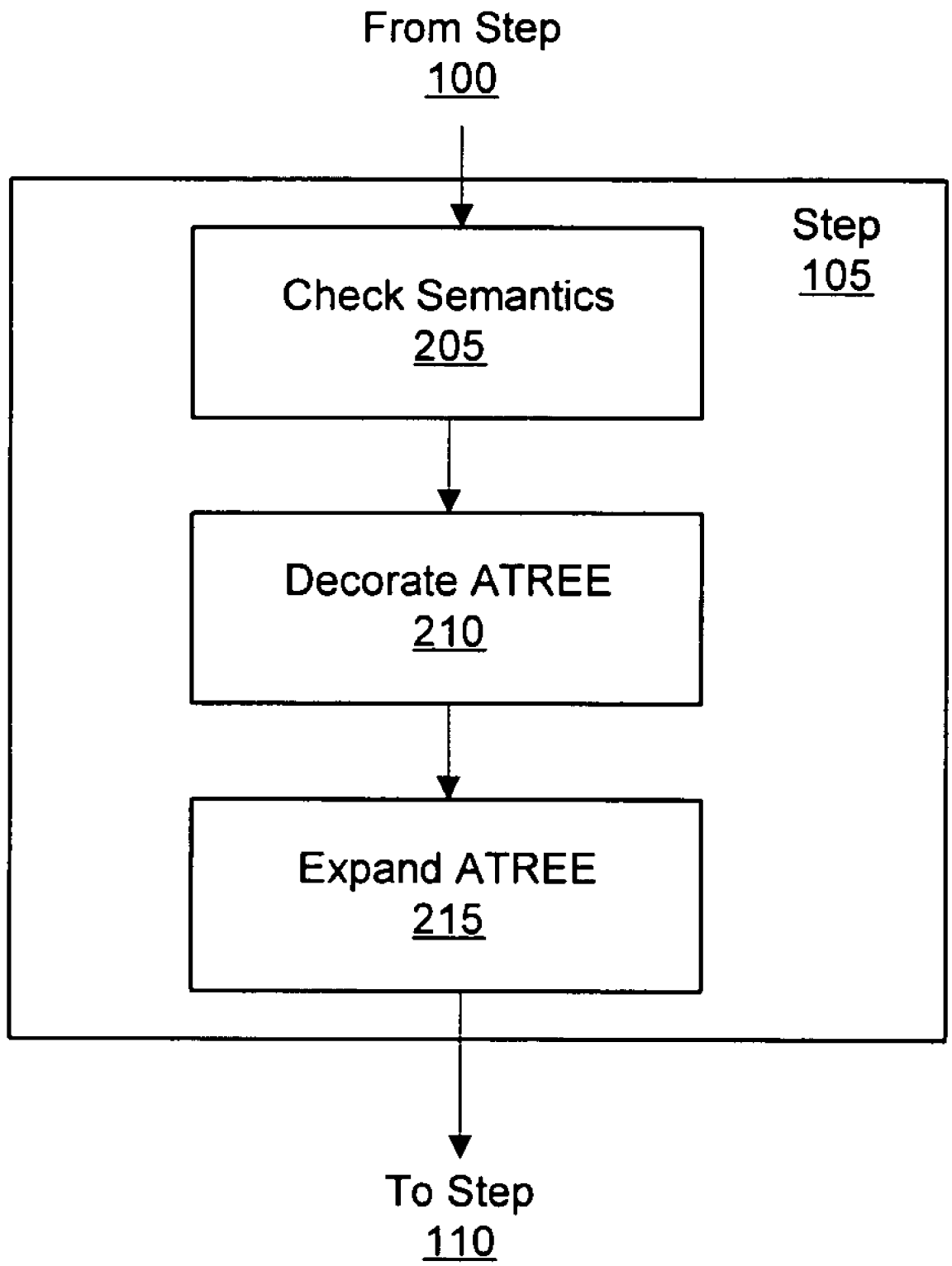
FIG. 2 illustrates a flow diagram of an exemplary method of performing step 105 shown in FIG. 1A in accordance with one or more aspects of the present invention.

FIG. 2 illustrates a flow diagram of an exemplary method of performing step 105 shown in FIG. 1A in accordance with one or more aspects of the present invention. In step 205 the high-level language compiler parses the source code and checks semantics of the ATree. The compiler builds the ATree as it parses the source code and the structure of the ATree parallels the source code. For example, each ATree node corresponds to a high-level language statement or part of statement, such as an identifier being referenced. Thus each ATree node has a unique "kind." ATree nodes typically have multiple child nodes, which are kept on a list. There are utility routines to traverse the children quickly and symbolically, based on the kind of node. In addition, there utility routines may be used to annotate nodes. Alternatively, a node may specify another node to define a path for use during the traversal process.

Macros in the source code are expanded and placed in the ATree. During parsing a temporary symbol table may be used to resolve identifiers, filling in pointers from the identifier reference's ATree node to the identifier declaration's ATree node. Assign statements are evaluated and replaced with constants associated with ATree nodes. The semantic checker runs over the ATree produced by the parser and checks for correctness. For example, the semantic checker may check that all identifiers are defined, identifiers are not defined twice, all paradigm options are legal, and the like. In some embodiments of the present invention, the semantic checker will also add annotations to the ATree that are used by later compile stages, for example to make PLU generators easier to write.

In step 210 the compiler generates the ATree from the source code and decorates the ATree, i.e., annotates useful information in the ATree. Each piece of information associated with a node has a kind and a type. The most common types are "int" and "ptr", where the latter is a pointer to another node in the ATree. Each ATree node is annotated with a source line number referencing a line in the source code for error reporting purposes, e.g., (kind=line_num, type=int).

In step 215 the compiler expands the ATree, performing optimizations and simplifications. For example, each instance of a particular CLU or PLU may be expanded. Furthermore, ATree optimizations may be performed, such as elimination of dead code, expression simplification based on constant expressions elsewhere in the source code, macro template expansion, and the like. The ATree is passed to the next stage for generation of the MTree and may be written out to a file that can be read for debugging purposes. The ATree file is used as the single source for generation of the MTree, which in turn is used to produce the RTree and subsequent targets, e.g., RTL, performance model, functional model, or the like.

FIG. 3A illustrates a flow diagram of an exemplary method of performing step 110 shown in FIG. 1A in accordance with one or more aspects of the present invention. In step 300 PLU generators are called to process the ATree and produce each PLU represented in another intermediate tree format, represented by the MTree. Similarly, in step 305 CLU generators are called to process the ATree and produce each CLU in the MTree for cases where CLU was written using the sublanguage of the high-level language. The MTree parallels the underlying modules and interfaces used to implement each PLU and CLU. Each PLU and CLU generator produces a partial MTree and all of the partial MTrees are linked together to form the complete MTree. The logic constructs used in the MTree are language independent and should not include timing constraints.

FIG. 3B illustrates a flow diagram of an exemplary method of performing step 120 shown in FIG. 1A in accordance with one or more aspects of the present invention. In step 310 the method determines if back annotated layout information is available, and, if so, in step 315 the MTree is combined with the back annotated layout information to produce an optimized MTree, the RTree. The RTree parallels the underlying modules and interfaces used to implement each PLU and CLU. The logic constructs used in the RTree are language independent and include timing constraints.

If, in step 310 back annotated layout information is not available, then in step 320 the RTree is produced by combining the MTree with default timing information. To generate the RTree estimates are used for the number of cycles each suboperation will take in order to pipeline a module. These estimates correspond to default values that are used when more accurate or other specific constraints aren't available, for example, prior to synthesis or physical layout of the modules or chip. In step 325 a target specific optimizer processes the RTree and generates a target model, the RTL model. PLUs usually define internal interfaces and data structures for data movement, detail that is not needed for the functional model target, but that is needed for the RTL model target. The RTree includes modules and interfaces needed to model the cycle to cycle behavior.

The optimized RTree for the RTL model target includes the entire RTL infrastructure for the chip along with timing information and it is clock cycle accurate. In step 435 the RTL model of the chip is produced from the optimized RTree produced in step 115 by the target-specific code emitter. The target-specific code emitter generates all RTL modules for PLUs and generates a module template, e.g., PLU wrapper, that includes all of the clocks, resets, input and output signals for CLUs.

Decoded programmable configuration information for CLUs is stored outside of the CLU and presented as an input as are programmable register values. The target-specific code emitter may also generate timing diagrams for each module reflecting the flow and timing of packets into and out of each module. The target-specific code emitter declares the interface protocols based on back annotated physical design information when available. The target-specific code emitter may also generate context switching logic for PLUs and CLUs that are identified as context swithable. Because most of the chip is automatically generated, code reviews may focus on the manually generated code, specifically the CLUs. Therefore, the code review process is more efficient and effort invested in development of the target-specific optimizers and target-specific code emitters may be leveraged for several chip designs.

In some embodiments of the present invention, target specific models produced using the RTree may be debugged at a higher-level, e.g., ATree, MTree or Rtree level, rather than at the RTL code level. A source-level debugger and waveform viewer could be used by a developer to debug simulations produced when the RTL code is executed. Therefore, the developer could debug the chip design in the high-level language, rather than the specific language of the final target model, e.g. Verilog, VHDL, C++, or the like.

The target-specific code emitter may also implement optimizations in the RTL model related to clocks. For example, enables for groups of flip-flops may be generated at a fine granularity, in order to achieve enable fine-grained clock gating. Similarly, block-level clock gating may be implemented for PLUs. Because the physical design model is also generated from the RTree, clock tree info needed for layout, the extra clock trees and subtrees are also integrated into the physical design model. In some embodiments of the present invention, the target-specific code emitter for the RTL model generates precomputed values one or more clock cycles earlier in order to meet timing requirements. For example split-transaction FIFO memories may be used to align read and write requests with data. In some embodiments of the present invention, a target-specific code emitter may also generate self-timed asynchronous logic or logic clocked on both-edges of a clock. In particular, such clocking schemes may be generated on a per-module basis.

The target-specific code emitter may also implement optimizations in the RTL model related to power. The generated RTL model should be generated to avoid switching buses back to zero unless block-level clock gating is going into effect. Some low-power techniques such as back-biasing require that RTL support slow wakeups so the generated RTL model should operate within this framework. RTL target-specific code emitter determine the input traffic rate for a block and may implement either back-biasing and a lower clock rate or accumulation of data to avoid passing smaller amounts of data over many clock cycles. For example, accumulation of data can be used to avoid keeping DRAM pages open for several clock cycles while smaller amounts data is read or written. For inter-partition interfaces, DBI (data bus inversion) may be implemented by comparing the bus state of the previous cycle to the current cycle and inverting the new data so that no more than 50% of the signals are changing cycle to cycle. This feature may be implemented based on floor planning distance information.

The target-specific code emitter may also implement optimizations in the RTL model related to testability and to improve yield. Specifically, logic may be inserted into server PLUs such as cross-bar interfaces to allow the module to be disabled or to reroute data if the PLU is not fully functional. Redundant modules or logic and supporting logic to enable use of the redundant modules may also be generated for critical PLUs or CLUs. Redundancy may be automatically added for RAMs, cache lines, inter-partition wires, or the like.

Figure 3C:
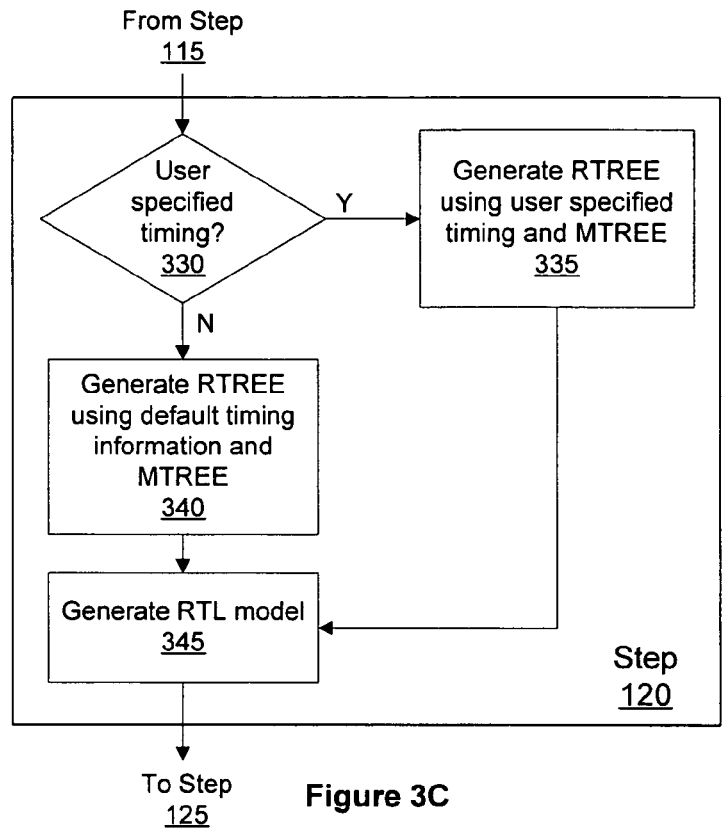

FIG. 3C illustrates a flow diagram of another exemplary method of performing step 120 shown in FIG. 1A in accordance with one or more aspects of the present invention. In step 330 the method determines if user specified timing information is available, and, if so, in step 335 the MTree is combined with the user specified timing information to produce the RTree. User specified timing information can be included in the PLU and CLU instantiations within the Mtree. Examples of user specified timing information include the type of registering used by a module, such as input and/out output registers and other pipelining constraints.

If, in step 330 user specified timing information is not available, then in step 360 the RTree is produced by combining the MTree with default timing information. In step 345 a target specific optimizer processes the RTree and generates a target model, the RTL model.

Figure 3D:
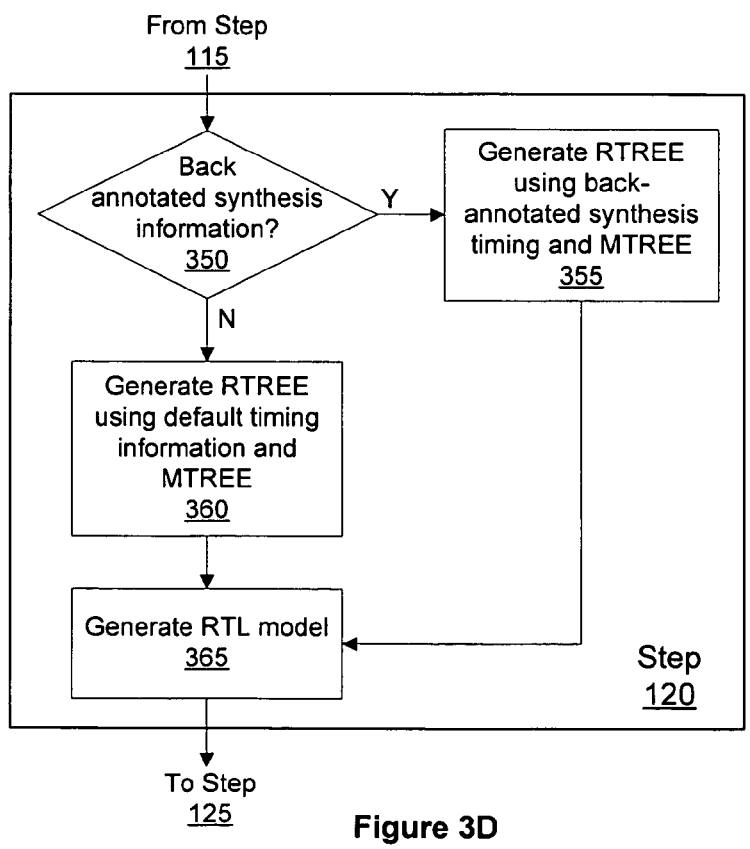

FIG. 3D illustrates a flow diagram of another exemplary method of performing step 120 shown in FIG. 1A in accordance with one or more aspects of the present invention. In step 350 the method determines if back annotated synthesis information is available, and, if so, in step 355 the MTree is combined with the back annotated synthesis information to produce the RTree. In particular, back annotated synthesis information includes paths that do not meet timing.

If, in step 350 user specified timing information is not available, then in step 360 the RTree is produced by combining the MTree with default timing information. In step 365 a target specific optimizer processes the RTree and generates a target model, the RTL model.

The methods shown in FIGS. 3B, 3C, and 3D may be combined, for example an RTree may be produced by combining the MTree with any combination of timing information, e.g. back annotated from layout or synthesis or user specified.

Target-Specific Optimizers

A target specific-optimizer is called to generate an optimized MTree or RTree for a particular target, e.g., RTL, performance simulator, functional model, or the like, by optimizing the MTree or RTree for that target. Targets that require cycle accurate information are generated using the RTree so that cycle-accurate optimizations are consistant across all PLUs. Such optimizations occur across the entire chip and are paradigm-independent, which means they can be leveraged for new paradigms. Furthermore, the optimizers may use back-annotated information from layout to produce the optimized RTrees (including physical layout based timing information) for each target. The optimizers also examine interfaces between module instantiations and optimize them. For example, the distance an interface is routed on chip will determine whether to use a valid/credit protocol with repeaters or a request/busy protocol, which may then affect input FIFO depths due to increased latency. Similarly, low bandwidth constraints may be used to determine widths of interfaces and whether to pass control and then data, or control with data.

A target-specific code emitter is then called to take the optimized MTree or RTree and write out final targets, e.g., the appropriate output text language, environment files, and reports. The target-specific code emitter walks the optimized MTree or RTree and generates code for the final target. The target-specific code emitters may also generate a report which links annotations in the MTree or RTree to the source code. Once PLUs, CLUs or simple CLU models, packets, and bandwidths are specified, performance simulator models and die area estimates may be generated. Similarly, when arrival rates of input packets are provided raw performance estimates, e.g., performance/area, performance/watt, or the like, may also be produced. More accurate estimates may be produced using a performance model as described in conjunction with FIG. 4C.

Figure 4A:
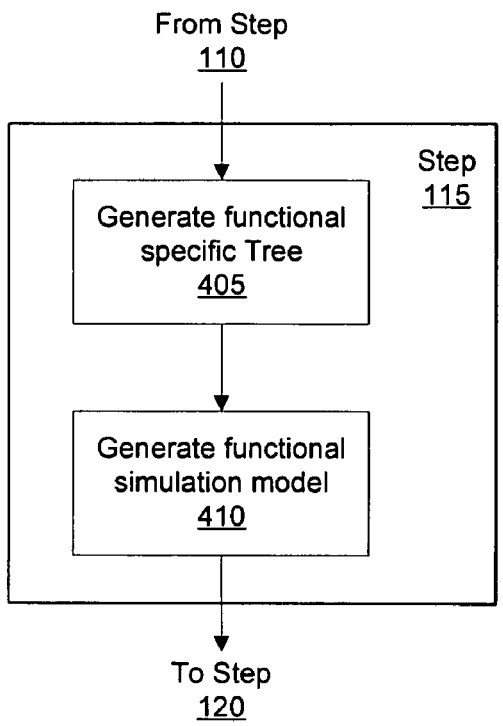
FIGS. 4A and 4B illustrate flow diagrams of exemplary methods of performing step 115 shown in FIG. 1A to generate a final target model in accordance with one or more aspects of the present invention.

FIG. 4A illustrates a flow diagram of an exemplary method of performing step 115 shown in FIG. 1A to generate a final target in accordance with one or more aspects of the present invention. In step 405 a target-specific optimizer is used to generate an optimized MTree for the functional model target. The simplest representation of each PLU is used in order to reduce the time needed to execute functional model simulations. In particular, zero-time function, i.e., procedural, calls may be used. In particular, zero-time function, i.e., procedural, calls may be used in the Mtree representation of a PLU. A different representation of each PLU, specifically a representation including cycle accurate information, may be used in the Rtree. For example, in the Rtree a PLU representation may include block level clock gating, flip-flop enables, data bus inversion, specific interface protocols and the like.

Likewise, CLU functions may also be represented by zero-time functions. Packets, including multi-cycle packets, may be provided in a single cycle to the CLU function for simulation. Presenting the multi-cycle packet in a single cycle also simplifies writing of the code that is inserted into the automatically generated CLU template since the programmer does not need to accumulate inputs over multiple clock cycles. Determination of how many clock cycles are used to transfer a packet is made at a later point in the design process, specifically, after physical design characteristics are known. The programmer need not specify the number of cycles needed, but rather may specific the bandwidth for a particular interface and let a target-specific optimizer determine the number of cycles, just as the target-specific optimizer determines the timing or protocol for the particular interface, e.g., source synchronous, request/busy, valid/credit, or the like.

In step 410 the functional model of the chip is produced from the optimized MTree by the target-specific code emitter. During simulation use of the zero-time function calls improves performance. For example, each packet is treated as an execution thread and is carried through as many functional blocks as possible, until it is blocked. A packet may be blocked when a functional block synchronizes input packets from different interfaces. A user-space thread package may be used to block a packet in that circumstance. When a PLU (server or client) has a client PLU component that access another server, such as a texture unit PLU reading a frame buffer (server). The texture unit PLU issues a read request (zero-time function call) for the frame buffer and the frame buffer responds in zero-time. Because the functional model is generated from a single database, the simulator knows the semantics of each client and server and may efficiently execute the functional model. When a packet generates more packets it is modeled as a "for loop" and a zero-time function call is issued for each pass through the loop.

The functional model may replace a conventional C++ simulation model that is typically written by one or more architects during development of a chip. Because the functional model is represented in the high-level language, the high-level language source level debugger may be used to debug the generated functional model rather than debugging the generated functional model directly using a C++ debugger.

Figure 4B:
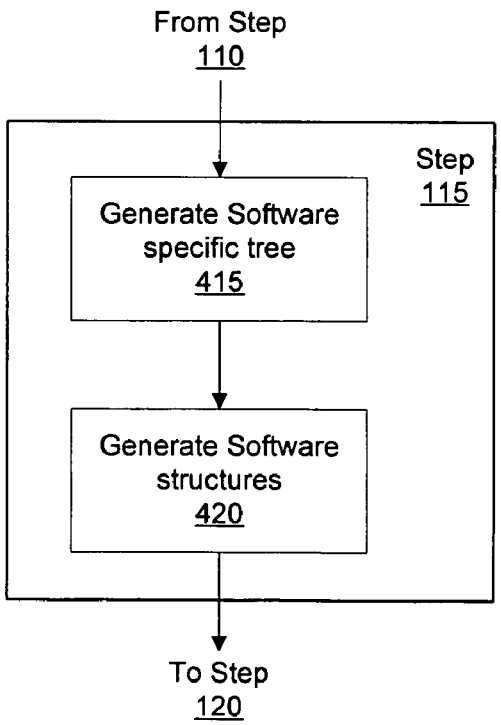

FIG. 4B illustrates a flow diagram of another exemplary method of performing step 115 shown in FIG. 1A to generate a final target in accordance with one or more aspects of the present invention. In step 415 a target-specific optimizer is used to generate an optimized MTree for the software model target. Specifically, the chip interfaces and programmable registers may be retained to produce another optimized MTree. In some embodiments of the present invention, PLU and CLU generators are also used to produce data structures used by software. In step 420 the software model of the chip is produced from the optimized MTree produced in step 415 by the target-specific code emitter. The software model may include templates for drivers, data structures, method injection code, code for controlling context switching, and virtual memory allocation routines.

Figure 4C:
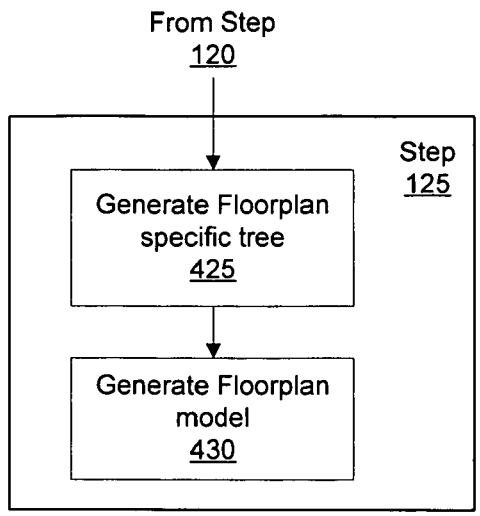
FIGS. 4C, 4D, 4E, and 4F illustrate flow diagrams of exemplary methods of performing step 125 shown in FIG. 1A to generate a final target model in accordance with one or more aspects of the present invention.

FIG. 4C illustrates a flow diagram of an exemplary method of performing step 125 shown in FIG. 1A to generate a final target in accordance with one or more aspects of the present invention. In step 425 a target-specific optimizer is used to generate an optimized RTree for the floor plan model target. In step 430 the floor plan model of the chip is produced from the optimized RTree by the target-specific code emitter. A target-specific code emitter may be used to produce a physical design floor plan model including a sea of modules and interfaces including instance counts and area and power estimates. Die area estimates are computed for the amount of logic and RAM for each PLU. More accurate estimates may be provided by the physical design model produced during synthesis. Area optimizations and timing optimization may also be performed by the physical design code emitter. For example, repeaters may be inserted as needed to meet timing on longer interconnects and flip-flops may be replaced with latches, pulsed latches, or pulsed flip-flops.

Prior to synthesis, CLU die area estimates may be provided by the programmer writing the CLU. Information generated as part of the floor plan model, such as wire lengths, may be combined with the MTree and used by target-specific optimizer and target-specific code emitters to determine inter-partition interface protocols, e.g., request/busy_next, valid/credit, or the like, and insert repeater flip-flops. The floor plan model may use static and dynamic power estimates for each module and interface to distribute modules within the floor plan model to balance power consumption across the die surface.

Figure 4D:
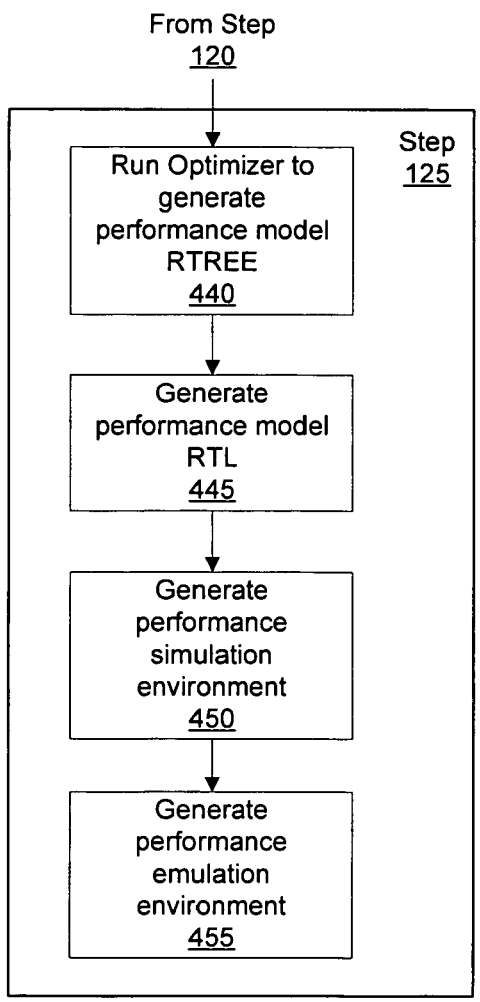

FIG. 4D illustrates a flow diagram of another exemplary method of performing step 125 shown in FIG. 1A to generate a final target in accordance with one or more aspects of the present invention. In step 440 a target-specific optimizer is used to generate an optimized RTree for the performance model target. In step 450 the performance model RTL of the chip is produced from the optimized RTree produced in step 115 by the target-specific code emitter. The performance model may be simulated to validate chip performance, permitting chip architects to quickly experiment with different designs. In step 450 the performance simulation environment is generated from the performance model RTree produced in step 440. In step 455 another target-specific code emitter is used to generate a performance emulation environment. The performance simulation environment and the performance emulation environment can be used to simulate the performance model RTL produced in step 445.

To produce the performance model RTL all of the data logic is removed and the control logic that can affect the performance flow of packets through the chip is retained to produce the optimized Rtree for the performance model. Conventionally, a cycle-accurate performance model is manually written and validated using the functional model of the chip. The ability to automatically generate the performance model shortens the time needed for performance validation because the performance model is generated from the common RTree. Therefore, it is consistant and up-to-date with the other final target models for the chip.

Performance models for PLUs are automatically generated while CLUs may be manually written. However, the performance model for a CLU is typically a subset of the functional model for the CLU. Therefore, the functional model for a CLU may be used to produce the performance model for the same CLU.

The die area and power consumption information for the removed data logic may be retained. The performance model may include back-annotated floor planning information to obtain distance and make late-binding interface decisions, such as interface widths and FIFO depths. The exact synchronous timing of logic may be included in the performance model. The high-level language provides a syntax for a programmer to specify portions of packet fields used between CLUs and PLUs that are needed for the performance model of the chip. Packets contained within PLUs are automatically generated in the performance model.

Similar to performance features, low-power features may be generated in order to model block-level clock gating, back biasing, clock slowdowns, and the like. Because the performance model does not include data, the percentage of data bits that are changing is estimated to produce dynamic power estimates. Back-annotated performance simulation results may be used to affect the types of low-power code generation decisions made by an RTL or other target-specific code emitter. For example, determination of the granularity of enables for RAMs or caches may be used to lower power consumption. The performance model may be simulated using various parameters to evaluate measured performance per unit area or performance per watt and make architecture tradeoffs.

Figure 4E:
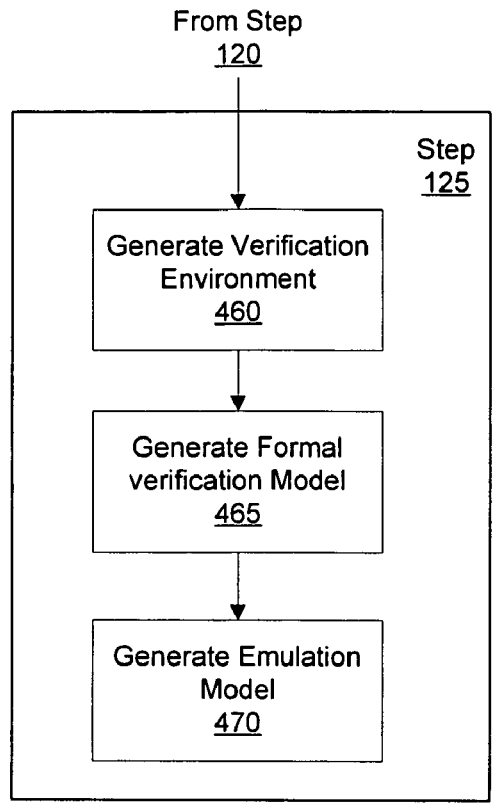

FIG. 4E illustrates a flow diagram of another exemplary method of performing step 125 shown in FIG. 1A to generate a final target in accordance with one or more aspects of the present invention. In step 460 a verification environment is generated corresponding to the RTree for the RTL model target. The verification environment may include block level testbenches, configuration files, common routines for injecting multi-cycle packets into blocks, and stimulus. Likewise, a full chip testbench, configuration files, common routines, and stimulus may also be generated. The verification environment may permit source code level debugging for the functional model and the RTL model of the chip. For example, a programmer may use a verification tool to observe a packet as it passes from one logical unit to another. The programmer may capture the packet state backwards and forwards in time to observe how it is changed.

In step 465 a formal verification model is produced from the RTree for the RTL model target. The formal verification model may be used to perform semi-formal or formal verification by generating unique input vectors based on an analysis of the input constraints of each block. Input vectors are included in files with explicit delays for semi-formal verification. The files are replayed and the results are compared with the functional model simulation results. Likewise, the input constraints may be generated for use during formal verification, for example, using symbolic analysis tools.

In step 470 an emulation model is generated from the RTree for the RTL target using a target-specific code emitter which generates only the timing portions of the RTL. For example, specific portions of the RTree may be included in an optimized RTree to emulate a portion of the chip. Alternatively, a version of RTL may be generated for emulation which is much smaller in die area and much slower. For example, caches may be removed, interfaces may be narrowed, and FIFO memory depths may be reduced to reduce the number of gates used by the emulation model. The emulation model could be mapped onto an emulation device and executed to simulate performance of the chip, even more efficiently than simulating performance using the performance model. The emulation model may also be used ito identify and fix bugs in control logic.

Figure 4F:
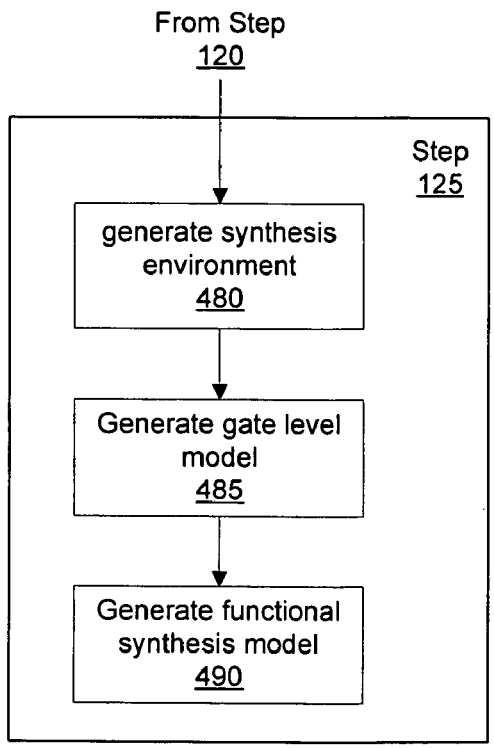

In addition to producing a performance model, an RTL model, a software model, a verification model, and the like from the Mtree and RTree, a target-specific code emitter may be used to produce a synthesis model (environment) for synthesizing the RTL optimized MTree or RTree to produce a physical design model of the chip. FIG. 4F illustrates a flow diagram of another exemplary method of performing step 120 shown in FIG. 1A to generate one or more final target models in accordance with one or more aspects of the present invention. In step 480 a synthesis environment is generated corresponding to the RTree for the RTL model target. The synthesis environment may include block level timing constraints and configuration files. In step 485 a target-specific code emitter generates a gate level model for the chip based on the RTree. The synthesis model and the floor plan model are used to produce the physical model of the chip as described further herein. In step 490 a target-specific code emitter generates a functional synthesis model, i.e., layout environment, for the chip based on the RTree.

The generated synthesis environment includes generated timing constraints for PLUs, parts of PLUs if a PLU crosses multiple partitions, CLUs, and pins. Some logical units may be synthesized using commercially available synthesis tools while other logical units may be custom designed or generated. The physical design code emitter may determine if some PLU structures may be generated as macros and normalized. Commonly used macros may then be designed as custom circuits for improved performance and die density and reduced latency and power. The physical design code emitter may also optimize routing to minimize wire capacitance, possibly relocating pins, specifying interface protocols, change interface widths (packets), changing datapath widths, and the like.

Using a single database, the ATree to generate a variety of final target models is advantageous because each final target model is consistant with the others. A change in a parameter is reflected in each of the final target models when they are regenerated. Building the final target models may be automated and subsets of the final target models may be built for specific purposes. For example, a programmer writing a CLU only needs to build the functional model, RTL model, verification model, and synthesis directories. PLUs and higher-level blocks are automatically generated. Therefore, the programmer may iterate through many design variations and quickly validate a CLU. The interfaces provided by the CLU template provide an abstraction layer that permits the programmer to work independently, i.e., without having to synchronize with potentially changing interfacing blocks. Furthermore, an ATree written in the high-level language may also be used for printed circuit board (PCB) design and verification. Futhermore, removing particular units or changing depths and widths may be applied to PCB design and verification.

Physical design information such as interface distances, block aspect ratios and pin locations, is provided for generation of the RTree and used during generation of the optimized RTrees. As parameters, such as clock speed are modified, the physical design model and associated information may be regenerated to tune the design. For example, it may be desirable to match the clock rate to the speed of a particular bus speed or external memory speed. Similarly, a physical design model for a lower speed chip may be quickly generated from the RTree. The lower speed chip has a reduced die area and corresponding lower production cost. Other parameters, such as power, performance, and functional features may be changed to quickly produce physical design models other chips using the same RTree or an RTree produced based on modified source code.

The optimized RTree used to generate the synthesis model includes information from the floor plan model that is used to produce a number of configuration entries needed for post-synthesis physical layout. This information includes partitioning, specifically for PLUs that are in different partitions, aspect ratios of each macro, pin locations on each macro, interconnect lengths, clock distribution, clock gating, test clocks, inserted repeaters, source-synchronous interfaces, and inserted functional built in self test (BIST) logic. Persons skilled in the art will appreciate that any system configured to perform the method steps of FIGS. 2, 3A, 3B, 3D, 3E, 4A, 4B, 4C, 4D, 4E, or 4F or their equivalents, is within the scope of the present invention.

An Exemplary System for Building Integrated Circuits Using Logical Units

Figure 5:
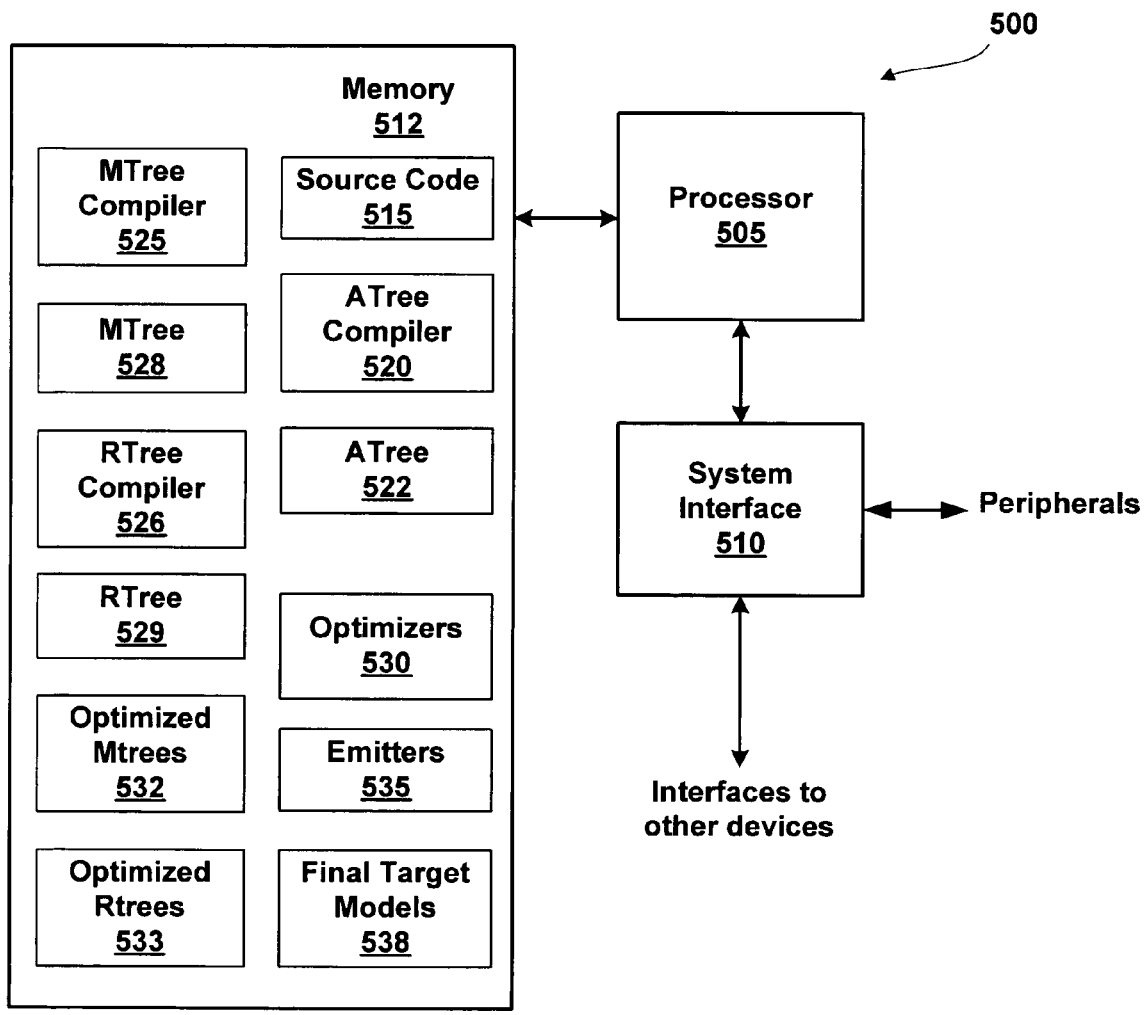
FIG. 5 is a block diagram of a computing system in accordance with one or more aspects of the present invention.

FIG. 5 is a block diagram of an exemplary embodiment of a respective computer system, generally designated 500, and including a processor 505, a memory 512, and a system interface 510 in accordance with one or more aspects of the present invention. Computing system 500 may be a desktop computer, server, laptop computer, palm-sized computer, tablet computer, game console, portable wireless terminal such as a PDA or cellular telephone, computer based simulator, or the like. Processor 505 that may include a system memory controller to interface directly to memory 512 (as shown) or may communicate with memory 512 through system interface 510. System interface 510 may be an I/O (input/output) interface or a bridge device including the system memory controller to interface directly to memory 512.

Source code 505, ATree compiler 520, ATree 522, MTree compiler 525, RTree compiler 526, MTree 528, RTree 529, optimizers 530, optimized MTrees 532, optimized RTrees 533, emitters 535, and final target models 538 are stored in memory 512. Source code 515 represented in the high-level language is parsed by processor 505 when ATree compiler 520 is executed. Processor 505 stores the generated ATree 522 in memory 512. The PLU and CLU generators included in MTree compiler 525 and RTree compiler 526 are executed by processor 505 to produce MTree 528 and RTree 529, respectively. Likewise, target-specific optimizers 530 are executed by processor 505 to produce optimized MTrees 532 and RTrees 533. Target-specific emitters 535 are executed by processor 505 to produce final target models 538.

Chip design time is shortened by using the common database to produce a variety of different models of the chip and environments. The optimizers and compilers used to produce the ATree, MTree, RTree, and specific models may be used to generate other chips, permitting programmers to efficiently and quickly write source code in the high-level language to produce each chip with greater reliability and in a shorter timeframe than when the different models are generated manually or using different databases. Interface protocols and packet transfers are abstracted, simplifying the design and verification process. Tedious optimizations that are traditionally performed manually to implement power optimizations, insert redundant logic, insert context switching logic, and the like, may be automatically generated at a module level. Furthermore, the common database facilitates feedback of physical design information into the RTree, for tighter coupling between the logic design and physical design of the chip.

Improvements in the chip design flow are another benefit of using the high-level language to specify the chip and generate the common database and final-target models. The common database may be used to generate performance models and simulation environments, generate functional models and simulation environments, generate register transfer level models and synthesis environments, generate software models, and generate emulation models. Furthermore, code reviews may be conducted more efficiently since only CLUs include manually written code. Die area may be used more efficiently through bit-sliced datapath layout and custom layout of particular PLUs and CLUs and homogeneous macro structures.

While the foregoing is directed to embodiments of the present invention, other and further embodiments of the invention may be devised without departing from the basic scope thereof, and the scope thereof is determined by the claims that follow. The foregoing description and drawings are, accordingly, to be regarded in an illustrative rather than a restrictive sense. The listing of steps in method claims do not imply performing the steps in any particular order, unless explicitly stated in the claim.

All trademarks are the respective property of their owners.

The invention claimed is:

1. A method of designing an integrated circuit, comprising:
   receiving an input of source code defining the integrated circuit written in a high-level language, wherein the high-level language is configured to specify programmable logical units (PLUs) and customizable logical units (CLUs);
   generating a first tree representation of the integrated circuit based on the source code, wherein the first tree representation includes components corresponding to the PLUs and CLUs, wherein the CLUs include a representation of interfaces to and from the CLUs;
   generating a second tree representation of the integrated circuit based on a parsing of the PLUs and CLUs of the first tree representation, wherein the second tree representation is not clock accurate and is not dependent on a type of model being produced;
   generating a third tree representation of the integrated circuit by combining the second tree representation with default timing information, wherein the third tree representation is clock accurate and corresponds to a model of the integrated circuit;
   generating a target model of the integrated circuit, by:
   obtaining target model information for the target model of the integrated circuit to be generated;
   selecting a target specific optimizer based on the target model information; and
   processing the third tree representation of the integrated circuit using the selected target specific optimizer.

2. The method of claim 1, further comprising modifying a parameter specifying a constraint and regenerating the second tree representation of the integrated circuit based on the modified parameter.

3. The method of claim 2, wherein the parameter specifies a clock speed constraint.

4. The method of claim 2, wherein the parameter specifies a power consumption constraint.

5. The method of claim 2, wherein the parameter specifies a bandwidth constraint.

6. The method of claim 1, further comprising combining timing information with the second tree representation of the integrated circuit such that the third tree representation of the integrated circuit is clock cycle accurate.

7. The method of claim 1, wherein the third tree representation of the integrated circuit includes time ordering dependencies and is not clock cycle accurate.

8. The method of claim 1, wherein the interfaces to and from the CLUs are specified by a multi-cycle packet that is independent of a particular interface protocol.

9. The method of claim 1, wherein the CLUs perform functions specified by manually written code included within the CLUs 10. The method of claim 1, wherein the target model corresponds to a functional model of the integrated circuit.

11. The method of claim 1, wherein the target model corresponds to a software model of the integrated circuit.

12. The method of claim 1, wherein the target model corresponds to a register transfer level model of the integrated circuit.

13. A computer-readable medium storing instructions for causing a computing device to produce various final target models of an integrated circuit, by performing the steps of:
   receiving an input of source code defining the integrated circuit written in a high-level language, wherein the high-level language is configured to specify programmable logical units (PLUs) and customizable logical units (CLUs);
   generating a first tree representation of the integrated circuit based on the source code, wherein the first tree representation includes components corresponding to the PLUs and CLUs, wherein the CLUs include a representation of interfaces to and from the CLUs;
   generating a second tree representation of the integrated circuit based on a parsing of the PLUs and CLUs of the first tree representation, wherein the second tree representation is not clock accurate and is not dependent on a type of model being produced;
   generating a third tree representation of the integrated circuit by combining the second tree representation with default timing information; and
   generating a target model of the integrated circuit, by:
   obtaining target model information for the target model of the integrated circuit to be generated;
   generating a target specific optimizer based on the target model information;
   selecting a target specific optimizer based on the target model information; and
   processing the third tree representation of the integrated circuit by using the selected target specific optimizer.

14. The computer-readable medium of claim 13, further comprising the step of combining timing information with the second tree representation of the the integrated circuit to generate the third tree representation of the integrated circuit.

15. The computer-readable medium of claim 13, further comprising the step of modifying a parameter specifying a constraint and regenerating the second tree representation of the integrated circuit based on the modified parameter.

16. The computer-readable medium of claim 15, wherein the parameter specifies a clock speed constraint.

17. The computer-readable medium of claim 15, wherein the parameter specifies a power consumption constraint.

18. The computer-readable medium of claim 15, wherein the parameter specifies a bandwidth constraint.

19. The computer-readable medium of claim 13, wherein the third-tree representation of the integrated circuit includes time ordering dependencies and is not clock cycle accurate.

20. The computer-readable medium of claim 13, wherein the interfaces to and from the CLUs are specified by a multi-cycle packet that is independent of a particular interface protocol.

21. The computer-readable medium of claim 13, wherein the CLUs perform functions specified by manually written code included within the CLUs.

22. The computer-readable medium of claim 13, wherein the target model corresponds to a functional model of the integrated circuit.

23. The computer-readable medium of claim 13, wherein the target model corresponds to a software model of the integrated circuit.

24. The computer-readable medium of claim 13, wherein the target model corresponds to a register transfer level model of the integrated circuit.

* * * * *